(12) United States Patent
Forbes (10) Patent No.: US 7,148,538 B2
(45) Date of Patent: Dec. 12, 2006

(54) VERTICAL NAND FLASH MEMORY ARRAY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/738,556

(22) Filed: Dec. 17, 2003

(65) Prior Publication Data

US 2005/0133851 A1    Jun. 23, 2005

(51) Int. Cl.
   *H01L 29/788* (2006.01)
   *H01L 29/76* (2006.01)
(52) U.S. Cl. .................. 257/316; 257/319; 257/321
(58) Field of Classification Search .......... 257/315–323
See application file for complete search history.

(56) References Cited

U.S. PATENT DOCUMENTS

| | | | |
|---|---|---|---|
| 4,558,344 A | 12/1985 | Perlegos | |
| 4,774,556 A | 9/1988 | Fujii | |
| 5,721,442 A * | 2/1998 | Hong | 257/316 |
| 5,888,868 A | 3/1999 | Yamazaki | |
| 5,909,618 A | 6/1999 | Forbes | |
| 5,936,274 A | 8/1999 | Forbes | |
| 5,973,352 A | 10/1999 | Noble | |
| 5,973,356 A | 10/1999 | Noble | |
| 6,072,209 A | 6/2000 | Noble | |
| 6,091,102 A * | 7/2000 | Sekariapuram et al. | 257/316 |
| 6,104,061 A | 8/2000 | Forbes | |
| 6,143,636 A | 11/2000 | Forbes | |
| 6,150,687 A | 11/2000 | Noble | |
| 6,191,470 B1 | 2/2001 | Forbes | |
| 6,198,125 B1 * | 3/2001 | Yamazaki et al. | 257/316 |
| 6,222,769 B1 | 4/2001 | Maruyama | |
| 6,238,976 B1 | 5/2001 | Noble | |
| 6,377,070 B1 | 4/2002 | Forbes | |
| 6,448,607 B1 | 9/2002 | Hsu | |
| 6,476,434 B1 | 11/2002 | Noble | |
| 6,577,533 B1 * | 6/2003 | Sakui et al. | 365/185.05 |
| 6,657,250 B1 | 12/2003 | Rudeck | |
| 6,680,508 B1 | 1/2004 | Rudeck | |
| 2002/0149081 A1 | 10/2002 | Goda | |
| 2003/0042512 A1 | 3/2003 | Gonzalez | |
| 2003/0043637 A1 | 3/2003 | Forbes | |
| 2003/0235075 A1 | 12/2003 | Forbes | |
| 2003/0235076 A1 | 12/2003 | Forbes | |
| 2003/0235079 A1 | 12/2003 | Forbes | |

(Continued)

FOREIGN PATENT DOCUMENTS

EP    0 485 018 A2    11/1990

(Continued)

OTHER PUBLICATIONS

U.S. Appl. No. 10/738,783, filed Dec. 17, 2003, Forbes.

(Continued)

*Primary Examiner*—Hung Vu
(74) *Attorney, Agent, or Firm*—Leffert Jay & Polglaze, P.A.

(57) ABSTRACT

Memory devices, arrays, and strings are described that facilitate the use of vertical floating gate memory cells in NAND architecture memory strings, arrays, and devices. NAND Flash memory strings, arrays, and devices in accordance with embodiments of the present invention, include vertical Flash memory cells to form NAND architecture memory cell strings and memory arrays. These vertical memory cell NAND architecture strings allow for an improved high density memory devices or arrays that can take advantage of the feature sizes semiconductor fabrication processes are generally capable of and still allow for appropriate device sizing for operational considerations.

16 Claims, 6 Drawing Sheets

| U.S. PATENT DOCUMENTS | | | JP | 05251711 | 9/1993 |

2004/0016953 A1    1/2004    Lindsay

FOREIGN PATENT DOCUMENTS

| EP | 0 562 257 A1 | 9/1993 |
| EP | 1 271 652 A | 1/2003 |
| JP | 01053577 AB | 1/1989 |

OTHER PUBLICATIONS

U.S. Appl. No. 10/769,116, filed Jan. 30, 2004, Forbes.
U.S. Appl. No. 10/785,310, filed Feb. 24, 2004, Forbes.

* cited by examiner

VERTICAL NAND FLASH MEMORY ARRAY

TECHNICAL FIELD OF THE INVENTION

The present invention relates generally to integrated circuits and in particular the present invention relates to NAND architecture Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that is typically erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bit line) or a "NAND" architecture (cells coupled into "strings" of cells, such that each cell is coupled indirectly to a bit line and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

As integrated circuit processing techniques improve, manufacturers try to reduce the feature sizes of the devices produced and thus increase the density of the IC circuits and memory arrays. In many cases, the feature sizes of the devices are limited by the device characteristics before the minimum feature size that the process is capable of is reached. In NAND Flash memory arrays in particular, as the channel length is reduced and the spacing between memory cells in the strings are reduced, a minimum size is reached that is primarily dictated by the operational characteristics of the floating gate memory cell devices that make up the memory strings.

For the reasons stated above, and for other reasons stated below which will become apparent to those skilled in the art upon reading and understanding the present specification, there is a need in the art for a method and architecture for producing a more closely spaced and, thus, higher density NAND Flash array.

SUMMARY OF THE INVENTION

The above-mentioned problems with producing more closely spaced and higher density NAND Flash array and other problems are addressed by the present invention and will be understood by reading and studying the following specification.

NAND architecture Flash memory devices and arrays, in accordance with embodiments of the present invention, facilitate the utilization of NAND architecture floating gate memory cells in high density memory arrays or NAND strings. Memory embodiments of the present invention utilize vertical Flash memory cells to form NAND architecture memory cell strings and memory arrays. These vertical memory cell NAND architecture strings allow for improved high density memory devices or arrays that can take advantage of the feature sizes semiconductor fabrication processes are generally capable of and still allow for appropriate device sizing for operational considerations.

For one embodiment, the invention provides a vertical floating gate memory cell string comprising a substrate, comprising one or more raised areas, defining trenches therebetween, a plurality of floating gate memory cells, wherein the floating gate memory cells are formed vertically on the sidewalls of one or more raised areas and/or trenches, and wherein the plurality of floating gate memory cells are coupled in a serial string by source/drain regions formed at the top of the one or more raised areas and at the bottom of the one or more trenches.

For another embodiment, the invention provides a vertical floating gate NAND architecture memory array comprising a substrate, comprising a plurality of pillars and associated intervening trenches, a plurality of floating gate memory cells, wherein the floating gate memory cells are formed vertically on the sidewalls of the plurality of pillars and trenches, and wherein the plurality of floating gate memory cells are coupled into a plurality of NAND architecture memory strings by source/drain regions formed at the top of the plurality of pillars and at the bottom of the associated trenches.

For yet another embodiment, the invention provides a system comprising a processor coupled to at least one memory device. The at least one memory device comprising a NAND architecture memory array formed on a substrate having a plurality of pillars and associated intervening trenches, a plurality of floating gate memory cells, wherein the floating gate memory cells are formed vertically on the sidewalls of the plurality of pillars and trenches, and wherein the plurality of floating gate cells are coupled into a plurality of NAND architecture memory strings by source/drain regions formed at the top of the plurality of pillars and at the bottom of the associated trenches.

For a further embodiment, the invention provides a method of forming a vertical floating gate NAND architecture memory cell string comprising forming one or more raised areas on a substrate, the raised areas defining associated intervening trenches, forming a plurality of floating gate memory cells on the sidewalls of the one or more raised areas, and forming one or more source/drain regions on the top of the one or more raised areas and at the bottom of the one or more associated intervening trenches.

For yet a further embodiment, the invention provides a method of forming a vertical floating gate NAND architecture memory array comprising forming a plurality of pillars and associated intervening trenches on a substrate, forming a plurality of vertical floating gate memory cells on the sidewalls of the plurality of pillars, and forming one or more source/drain regions on the top of the plurality of pillars and at the bottom of the associated intervening trenches to form a plurality of NAND architecture memory strings.

Other embodiments are also described and claimed.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Memory strings, arrays, and devices in accordance with embodiments of the present invention, facilitate the use of floating gate memory cells in high density vertical NAND architecture memory strings, arrays, and devices. Memory embodiments of the present invention include vertical Flash memory cells to form NAND architecture memory cell strings and memory arrays. These vertical memory cell NAND architecture strings allow for an improved high density memory devices or arrays that can take advantage of the feature sizes semiconductor fabrication processes are generally capable of and still allow for appropriate device sizing for operational considerations.

As stated above, as integrated circuit processing techniques improve, manufacturers try to reduce the feature sizes of the devices produced and thus increase the density of the IC circuits and memory arrays. In many cases, the feature sizes of the devices are limited by the device characteristics before the minimum feature size that the process is capable of is reached. In NAND Flash memory arrays in particular, as the channel length is reduced and the spacing between memory cells in the strings are reduced, a minimum size is reached that is primarily dictated by the operational characteristics of the floating gate memory cell devices that make up the memory strings. As a result, this limits the maximum density of an array of memory cells is limited even if the process technology can attain even smaller features and/or channel lengths. In particular, this is an issue in higher capacity memory types, such as NAND architecture Flash arrays and devices, where small changes in the memory cell footprint (e.g., memory cell channel widths) and the cell density in the array can have a large effect on the overall array size and the resulting storage capacity. By constructing their floating gate memory cells vertically, embodiments of the present invention allow for increases in memory array cell density and improved utilization of process minimum feature size capabilities, while maintaining the size of the memory cell channel to allow for appropriate device operation.

As previously stated, the two common types of Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the Flash memory.

A NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND Flash array architecture to have a higher memory cell density than a comparable NOR Flash array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the Flash memory.

Figure 1A:
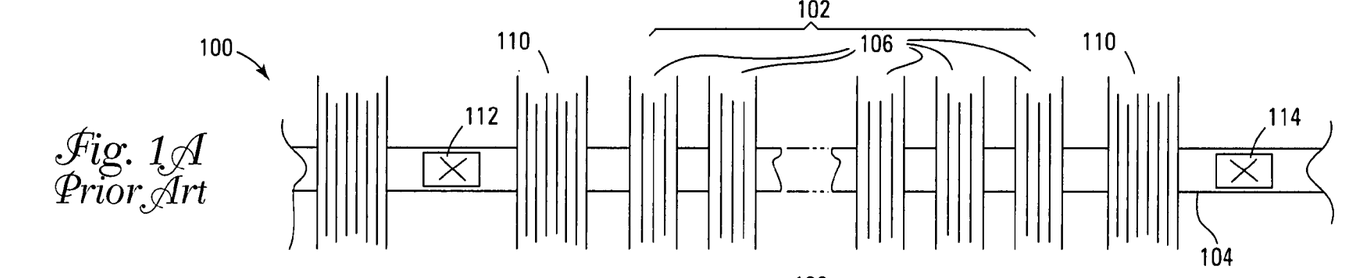
FIGS. 1A and 1B detail a planar NAND Flash memory array of the prior art.
Figure 1B:
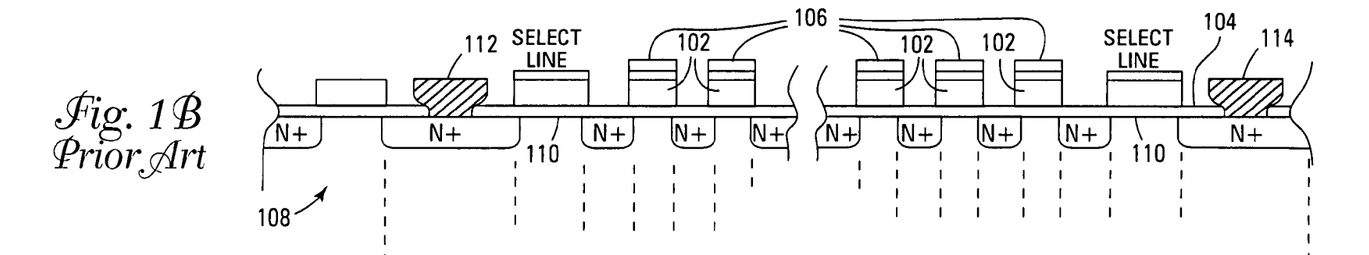

FIGS. 1A and 1B show a simplified planar NAND Flash memory array of the prior art. FIG. 1A details a top view of a planar NAND Flash memory string 104 of a NAND Flash memory array 100, a side view of the planar NAND Flash memory string 104 is detailed in FIG. 1B. In FIGS. 1A and 1B, a series of floating gate memory cells 102 are coupled together in a series NAND string 104 (typically of 8, 16, 32, or more cells). Each floating gate memory cell 102 has a gate-insulator stack that is made of a tunnel insulator on top of a substrate 108, a floating gate formed on the tunnel insulator, an intergate/interpoly insulator formed over the floating gate, and a control gate 106 (typically formed in a control gate line, also known as a word line) formed over the intergate/interpoly insulator. N+ doped regions are formed between each gate insulator stack to form the source and drain regions of the adjacent floating gate memory cells, which additionally operate as connectors to couple the cells of the NAND string 104 together. Select gates 110, that are coupled to gate select lines, are formed at either end of the NAND floating gate string 104 and selectively couple opposite ends of the NAND floating gate string 104 to a bit line contact 112 and a source line contact 114.

Figure 2A:
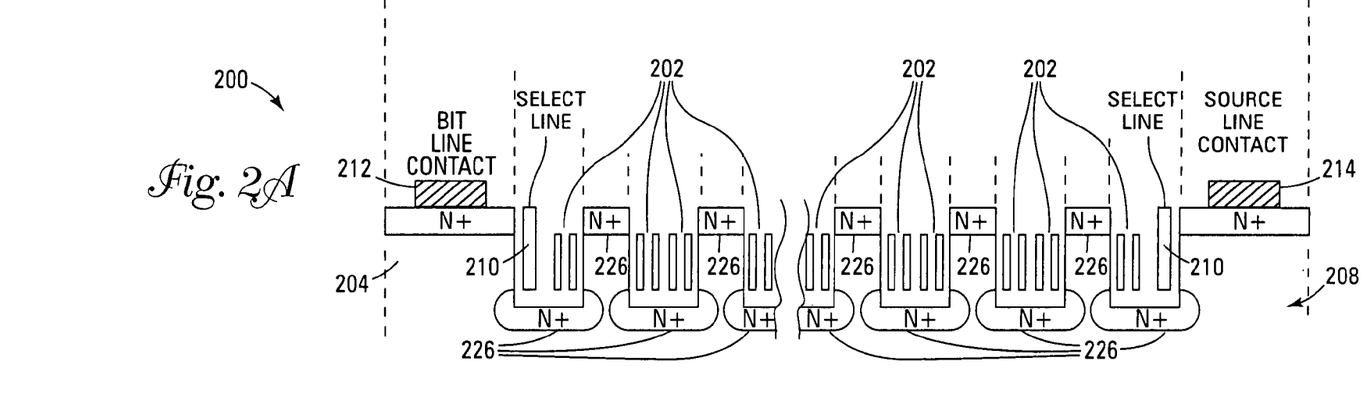
FIGS. 2A–2D detail vertical NAND Flash memory array strings in accordance with embodiments of the present invention.
Figure 2B:
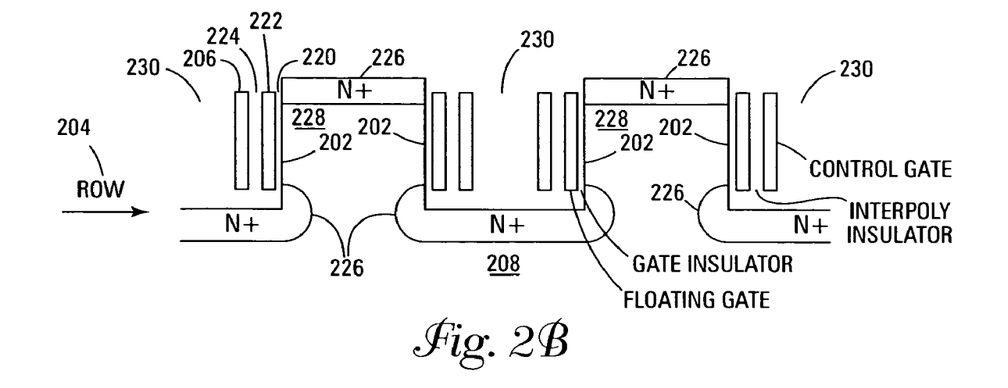
Figure 2C:
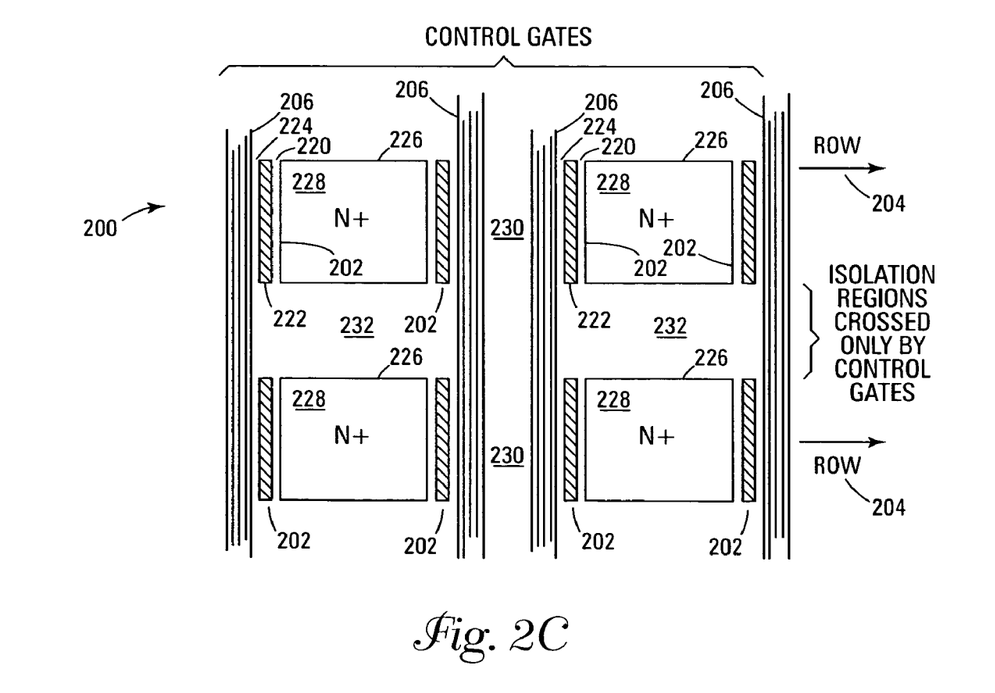

FIGS. 2A–2D detail vertical Flash cells and NAND architecture Flash memory strings in accordance with embodiments of the present invention. FIG. 2A details a side view of a simplified vertical NAND architecture Flash memory array string 204 of a NAND architecture Flash memory array 200, a top view of the vertical NAND Flash memory array 200 is detailed in FIG. 2C showing sections of two vertical NAND Flash memory array strings 204. A three dimensional view of the vertical NAND Flash memory array 200 is detailed in FIG. 2D. Methods of forming vertical memory cells are detailed in U.S. Pat. No. 5,936,274, titled "High density flash memory", issued Aug. 10, 1999, which is commonly assigned. Methods of forming vertical split control gates are detailed U.S. Pat. No. 6,150,687, titled "Memory cell having a vertical transistor with buried source/drain and dual gates", issued Nov. 21, 2000, and U.S. Pat. No. 6,072,209, titled "Four $F^2$ folded bit line DRAM cell structure having buried bit and word lines", issued Jun. 6, 2000, which are also commonly assigned.

In FIG. 2A, a series of vertically formed floating gate memory cells 202 are coupled together in a series NAND string 204 (typically of 8, 16, 32, or more cells). As shown in the detailed section of vertical NAND architecture Flash memory array string 204 of FIG. 2B, in creating the vertical NAND Flash memory array string 204 a series of substrate pillars 228 are formed in a substrate 208 with trenches 230 located between them. The vertical floating gate memory cells 202 are then formed on the sidewalls of the pillars 228 within the trenches 230. Each vertical floating gate memory cell 202 is formed on the sidewalls of the substrate pillars 228 (for two floating gate memory cells 202 per trench 230) and has a gate-insulator stack made of a tunnel insulator 220 formed on the surface of the sidewall, a floating gate 222 (typically of polysilicon) formed on the tunnel insulator 220, an intergate/interpoly insulator 224 formed over the floating gate 222, and a control gate 206 (typically formed in a control gate line, also known as a word line) formed over the intergate/interpoly insulator 224. In one embodiment the substrate pillars 228 and trenches 230 are formed by patterning a masking material that is layered over the substrate 208 and anisotropically etching the trenches 230. The gate-insulator stack of each floating gate memory cell 202 are formed in one embodiment by successive layering of each of the materials of the gate insulator stack over the pillars 228 and trenches 230, followed by a mask and directional etch of the deposit of each layer to leave only the material deposited on the sidewall of the pillars 228. In another embodiment, differing layers of the gate-insulator stack are formed and then masked and directionally etched in a single step.

N+ doped regions 226 are formed at the top of the substrate pillars 228 and at the bottom of the trenches 230 between each vertical floating gate memory cell/gate-insulator stack 202 to form the source and drain regions of the adjacent floating gate memory cells 202 and couple the memory cells 202 together to form the vertical NAND architecture memory string 204. It is noted that the N+ source/drain regions 226 may be formed before or after the formation of the floating gate memory cells/gate-insulator stack 202. Select gates 210, that are coupled to gate select lines, are formed at either end of the NAND floating gate memory string 204 and selectively couple opposite ends of the NAND floating gate memory string 204 to a bit line contact 212 and a source line contact 214.

Figure 2D:
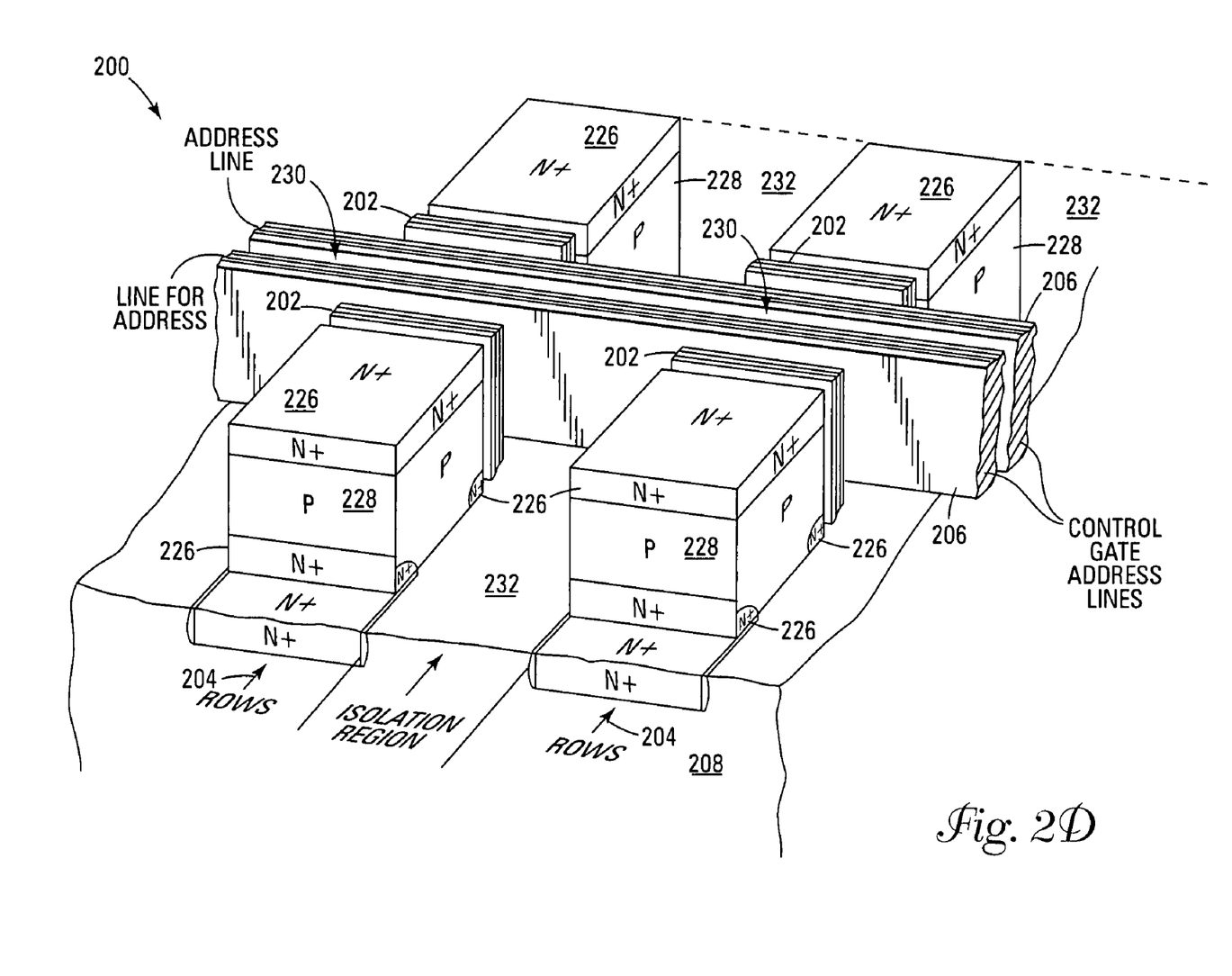

As stated above, in the top view of the vertical NAND architecture Flash memory array 200 of FIG. 2C and in the three dimensional view of FIG. 2D, sections of two vertical NAND architecture Flash memory strings 204 are shown. Between the substrate pillars 228 of the two vertical NAND architecture Flash memory array strings 204 isolation regions 232 have been formed to isolate the vertical NAND architecture Flash memory array strings 204 from each other. These isolation regions 232 are typically formed of an oxide insulator. It is noted that the isolation regions 232 between the vertical NAND architecture memory strings 204 can be extended into the substrate 208 to allow the formation of P-wells, where each P-well contains a single NAND architecture memory string 204 and can be biased in isolation from the other strings 204 of the array 200. It is also noted that the control gate/word address lines 206 cross these isolation regions 232 so that each control gate/word address line 206 controls the operation of floating gate memory cells 202 across multiple vertical NAND architecture memory strings 204.

In the vertical NAND architecture Flash memory array 200 and vertical NAND architecture memory strings 204 of FIGS. 2A–2D, the channel length of each floating gate memory cell 202 is determined by the depth of the trenches 230 and not by the minimum feature size. Due to the vertical form of the NAND architecture Flash memory array 200 and NAND architecture memory strings 204 of embodiments of the present invention, a vertical NAND architecture Flash memory array string 204 can be produced that typically has twice the density for a given string horizontal run length than a corresponding planar NAND architecture Flash memory array string 102.

Figure 3A:
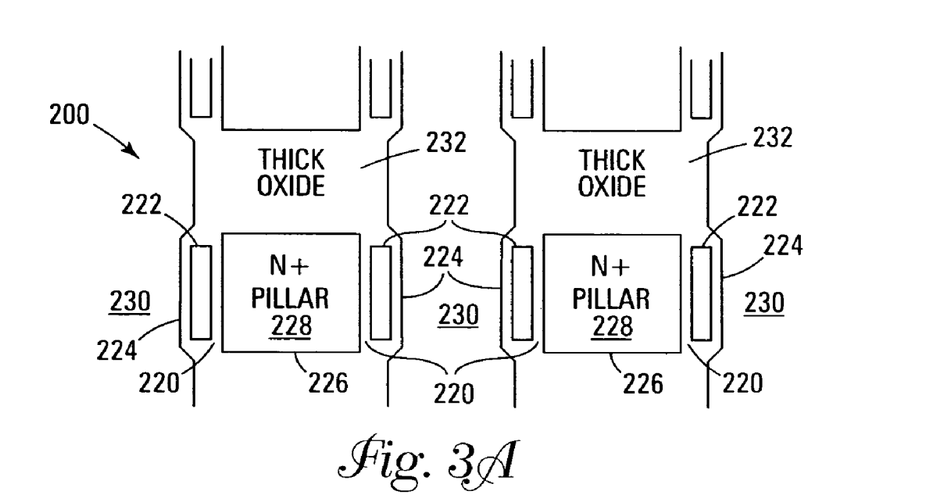
FIGS. 3A and 3B detail vertical floating gate memory cells in accordance with embodiments of the present invention.
Figure 3B:
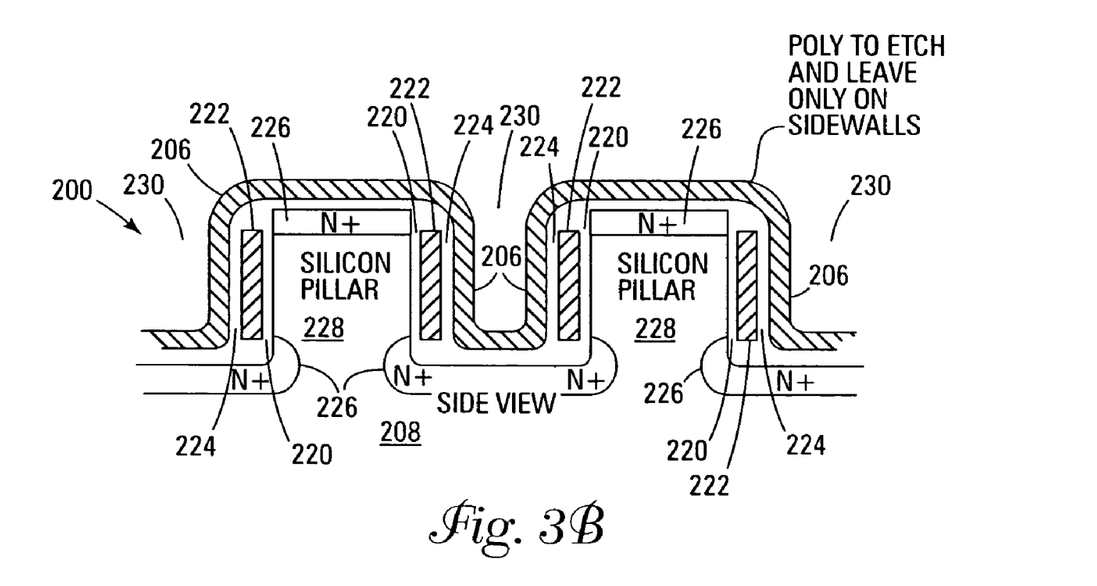

FIGS. 3A and 3B detail vertical Flash cells in accordance with embodiments of the present invention at a mid-fabrication stage. As stated above, in creating the vertical NAND Flash memory array string 204 a series of substrate pillars 228 are formed in a substrate 208 with trenches 230 located between them. The vertical floating gate memory cells 202 are then formed on the sidewalls of the pillars 228 within the trenches 230. In creating each gate-insulator stack, a tunnel insulator 220 is formed on the surface of the sidewall, a floating gate 222 is formed on the tunnel insulator 220, an intergate/interpoly insulator 224 is formed over the floating gate 222, and a control gate 206 is formed over the intergate/interpoly insulator 224. FIG. 3A details a top view, and FIG. 3B details a corresponding side view, of a section of memory array 200 at a mid-fabrication stage of forming the gate-insulator stack of the vertical floating gate memory cells 202. In FIGS. 3A and 3B, the substrate pillars 228 and trenches 230 have been already formed by masking and anisotropically etching the trenches 230 in the substrate 208. N+ doped regions 226 have been formed at the top of the substrate pillars 228 and at the bottom of the trenches 230 to form the source/drain regions of the floating gate memory cells 202. The gate-insulator stack of each floating gate memory cell 202 have been partially formed, having a formed the tunnel insulator 220, the floating gate 222, and the intergate/interpoly insulator 224, by successive depositing, masking, and directional etching of the layers. A layer of polysilicon which will form the control gate layer and/or address lines 206 is shown deposited over the pillars 228, trenches 230, and partially formed gate-insulator stacks of the memory array 200. A layer of masking material is then formed over the polysilicon layer and patterned. The excess masking material is removed and the memory array 200 is anisotropically/directionally etched to remove the undesired portions of the deposited polysilicon and form the control gate layer and/or address lines 206 on the sidewalls of the pillars 228 and trenches 230.

Figure 4A:
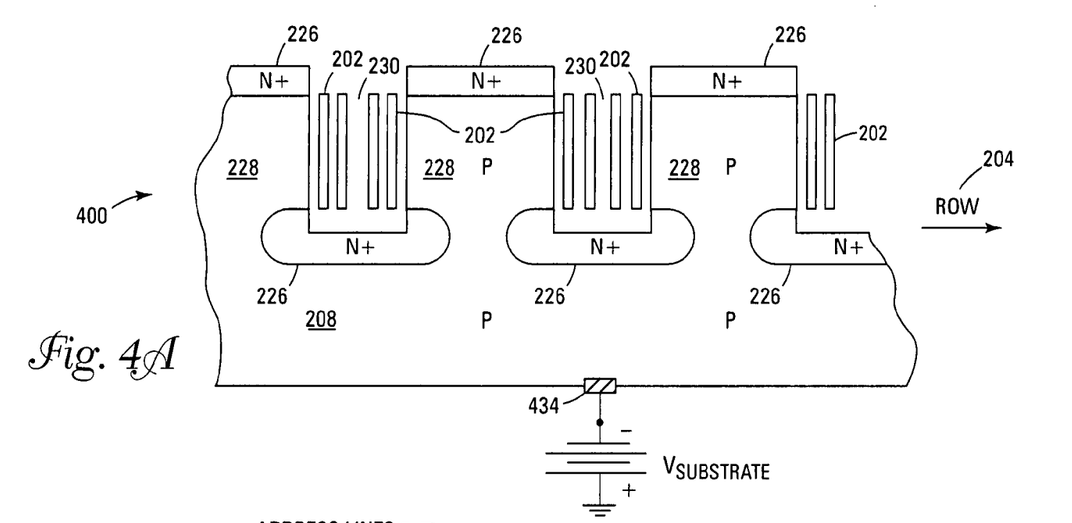
FIGS. 4A and 4B detail a vertical NAND string and corresponding circuit in accordance with embodiments of the present invention.

FIGS. 4A and 4B detail a NAND architecture Flash memory string in accordance with embodiments of the present invention. FIG. 4A details vertical NAND architecture floating gate memory cells 202 and substrate 208 of a vertical NAND architecture Flash memory array string 400 in accordance with embodiments of the present invention. In FIG. 4A, the substrate 208 of the vertical NAND architecture Flash memory array string 400 is P-doped. A substrate connection 434 is shown, which can allow for biasing of the P-doped substrate 208. It is noted that other forms of substrate doping, substrate biasing, and substrate types and regions (including, but not limited to silicon-on-sapphire (SOS) technology, silicon-on-insulator (SOI) technology, thin film transistor (TFT) technology, doped and undoped semiconductors, epitaxial layers of silicon supported by a base semiconductor) in embodiments of the present invention are possible and should be apparent to those skilled in the art with the benefit of the present invention.

Figure 4B:
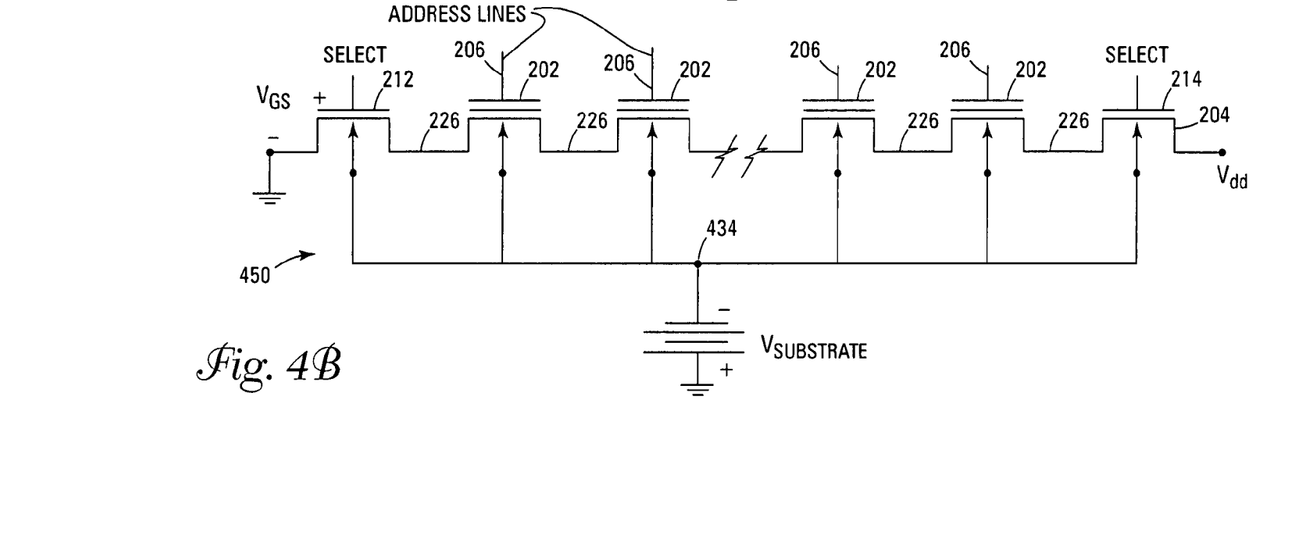

FIG. 4B details an equivalent circuit schematic 450 of a vertical NAND architecture Flash memory string 204, showing floating gate memory cells 202 and substrate connection 434, in accordance with embodiments of the present invention. As can be seen, the schematic 450 provides the same equivalent circuit as that of a conventional planar NAND architecture Flash memory string 104.

Programming of the floating gate memory cells 202 of the vertical NAND architecture Flash memory strings 204 embodiments of the present invention can be accomplished by conventional tunnel injection of electrons with a positive gate 206 voltage with respect to the substrate or P-well 208. In another embodiment of the present invention, programming is accomplished by channel hot electron injection (HEI). Erasure of the floating gate memory cells 202 of embodiments of the present invention can accomplished by conventional tunneling or negative voltages applied to the control gate 206 voltages with respect to the substrate or P-well 208. In alternative embodiments of the present invention, substrate enhanced hot electron injection (SEHE) can be utilized for floating gate memory cell 202 programming and/or substrate enhanced band to band tunneling induced hot hole injection (SEBBHH) for floating gate memory cell 202 erasure.

Figure 5:
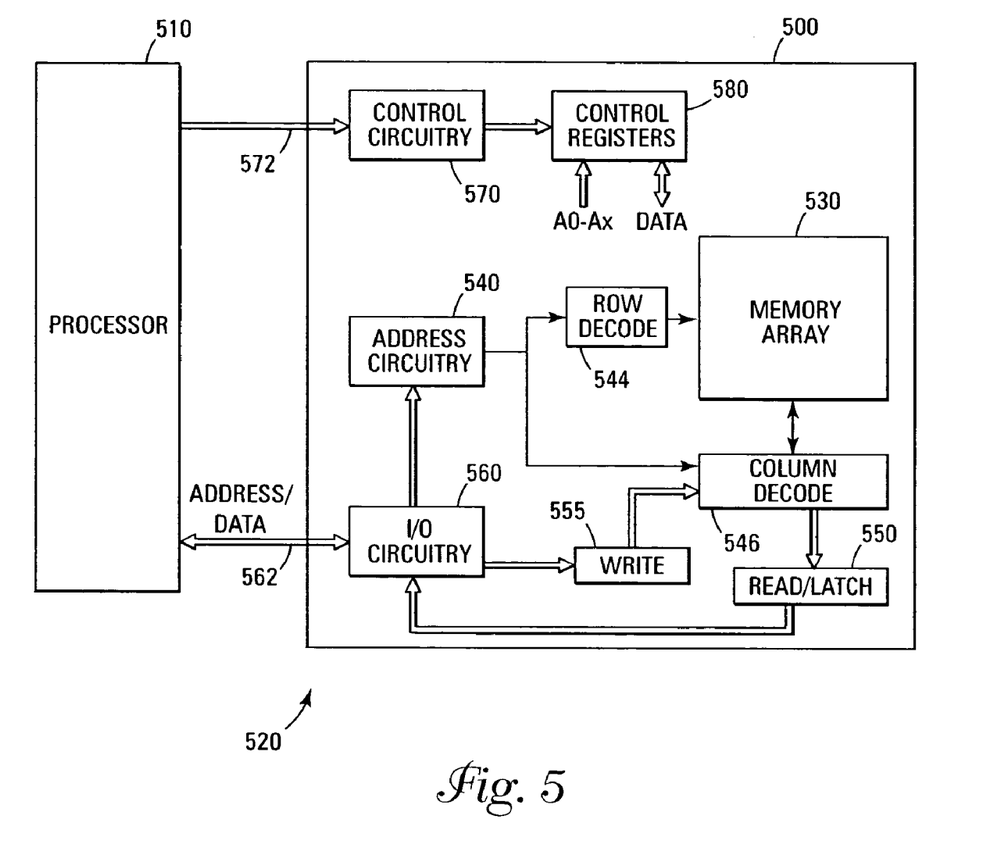
FIG. 5 details a block diagram of an electronic system in accordance with embodiments of the present invention.

FIG. 5 illustrates a functional block diagram of a memory device 500 that can incorporate the vertical NAND architecture Flash memory cells of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of vertical Flash memory cells 530. In one embodiment, the memory cells are vertical floating gate memory cells and the memory array 530 are arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 540 is provided to latch address signals provided on address/data bus 562. Address signals are received and decoded by a row decoder 544 and a column decoder 546 to access the memory array 530. It will be appreciated by those skilled in the art, with the benefit of the present description, that the size of address input on the address/data bus 562 depends on the density and architecture of the memory array 530. That is, the size of the input address increases with both increased memory cell counts and increased bank and block counts. It is noted that other address input manners, such as through a separate address bus, are also known and will be understood by those skilled in the art with the benefit of the present description.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections in the address/data bus 562 with the processor/controller 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller.

Since the vertical floating gate memory cells of the present invention use a CMOS compatible process, the memory device 500 of FIG. 5 may be an embedded device with a CMOS processor.

The Flash memory device illustrated in FIG. 5 has been simplified to facilitate a basic understanding of the features of the memory. A more detailed understanding of internal circuitry and functions of Flash memories are known to those skilled in the art.

It is also noted that other vertical NAND architecture floating gate memory strings, arrays, and memory devices in accordance with embodiments of the present invention are possible and should be apparent to those skilled in the art with benefit of the present disclosure.

CONCLUSION

Memory devices, arrays, and strings have been described that facilitate the use of vertical floating gate memory cells in NAND architecture memory strings, arrays, and devices. NAND Flash memory strings, arrays, and devices in accordance with embodiments of the present invention, include vertical Flash memory cells to form NAND architecture memory cell strings and memory arrays. These vertical memory cell NAND architecture strings allow for an improved high density memory devices or arrays that can take advantage of the feature sizes semiconductor fabrication processes are generally capable of and still allow for appropriate device sizing for operational considerations.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A vertical floating gate memory cell string, comprising:
a substrate, comprising one or more raised areas, defining trenches therebetween;
a plurality of floating gate memory cells, wherein the floating gate memory cells are formed vertically on the sidewalls of one or more raised areas and/or trenches; and
wherein the plurality of floating gate memory cells are coupled in a serial string by source/drain regions formed at the top of the one or more raised areas and at the bottom of the one or more trenches;
wherein the one or more raised areas and/or trenches of the vertical floating gate memory cell string are formed on a P-well isolation region formed on the substrate and where the vertical floating gate memory cell string is isolated from adjacent structures formed on the substrate by one or more isolation regions formed between the vertical floating gate memory cell string and the adjacent structures, thereby defining one or more sidewalls of the P-well isolation region.

2. The vertical floating gate memory cell string of claim 1, wherein the raised areas are pillars.

3. A vertical floating gate memory cell string, comprising:
a substrate, comprising one or more raised areas, defining trenches therebetween;
a plurality of floating gate memory cells, wherein the floating gate memory cells are formed vertically on the sidewalls of one or more raised areas and/or trenches;
wherein the plurality of floating gate memory cells are coupled in a serial string by source/drain regions formed at the top of the one or more raised areas and at the bottom of the one or more trenches; a plurality of word lines, wherein each word line is coupled to a control gate of a floating gate memory cell of the string;
a bitline, wherein the bitline is coupled to a drain of a first floating gate memory cell of the string; and
a source line, wherein the source line is coupled to a source of a last memory cell of the string.

4. The vertical floating gate memory cell string of claim 3, wherein the first and last floating gate memory cells are coupled to the bitline and source line through a first and second select transistor.

5. A vertical floating gate NAND architecture memory array, comprising:
a substrate, comprising a plurality of pillars and associated intervening trenches;
a plurality of floating gate memory cells, wherein the floating gate memory cells are formed vertically on the sidewalls of the plurality of pillars and trenches; and
wherein the plurality of floating gate memory cells are coupled into a plurality of NAND architecture memory strings by source/drain regions formed at the top of the plurality of pillars and at the bottom of the associated trenches;
wherein an isolation region is formed between adjacent NAND architecture memory strings of the plurality of NAND architecture memory strings;
wherein each NAND architecture memory string of the plurality of NAND architecture memory strings is formed on a separate P-well isolation region formed on the substrate, where one or more sidewalls of the separate P-well isolation regions are defined by the isolation region formed between adjacent NAND architecture memory strings.

6. The vertical floating gate NAND architecture memory array of claim 5, wherein the isolation region is an oxide insulator.

7. A vertical floating gate NAND architecture memory array, comprising:
a substrate, comprising a plurality of pillars and associated intervening trenches;
a plurality of floating gate memory cells, wherein the floating gate memory cells are formed vertically on the sidewalls of the plurality of pillars and trenches;
wherein the plurality of floating gate memory cells are coupled into a plurality of NAND architecture memory strings by source/drain regions formed at the top of the plurality of pillars and at the bottom of the associated trenches;
a plurality of word lines, wherein each word line is coupled to one or more control gates of one or more floating gate memory cells, where each of the one or more floating gate memory cells is from a differing NAND architecture memory string of the plurality of NAND architecture memory strings;
at least one bitline, wherein the at least one bitline is coupled to a source/drain of a first floating gate memory cell of each NAND architecture memory string of the plurality of NAND architecture memory strings; and
at least one source line, wherein the at least one source line is coupled to a source/drain of a last memory cell of each NAND architecture memory string of the plurality of NAND architecture memory strings.

8. The vertical floating gate NAND architecture memory array of claim 7, wherein the first and last floating gate memory cells of each NAND architecture memory string are coupled to the at least one bitline and the at least one source line through a first and second select transistor.

9. A vertical floating gate NAND architecture memory array, comprising:
a substrate, comprising a plurality of pillars and associated intervening trenches;

a plurality of floating gate memory cells, wherein the floating gate memory cells are formed vertically on the sidewalls of the plurality of pillars and trenches;

wherein the plurality of floating gate memory cells are coupled into a plurality of NAND architecture memory strings by source/drain regions formed at the top of the plurality of pillars and at the bottom of the associated trenches; and wherein each NAND architecture memory string of the plurality of NAND architecture memory strings is formed on a separate P-well isolation region formed on the substrate, where one or more sidewalls of the separate P-well isolation regions are defined by one or more isolation regions formed between adjacent NAND architecture memory strings of the plurality of NAND architecture memory strings.

10. A NAND architecture Flash memory device, comprising:

a vertical floating gate NAND architecture memory array formed on a substrate having a plurality of pillars and associated intervening trenches;

a plurality of floating gate memory cells, wherein the floating gate memory cells are formed vertically on the sidewalls of the plurality of pillars and trenches; and wherein the plurality of floating gate memory cells are coupled into a plurality of NAND architecture memory strings by source/drain regions formed at the top of the plurality of pillars and at the bottom of the associated trenches;

wherein an isolation region is formed between adjacent NAND architecture memory strings of the plurality of NAND architecture memory strings;

wherein each NAND architecture memory string of the plurality of NAND architecture memory strings is formed on a separate P-well isolation region formed on the substrate, where one or more sidewalls of the separate P-well isolation regions are defined by one or more isolation regions formed between adjacent NAND architecture memory strings of the plurality of NAND architecture memory strings.

11. The NAND architecture Flash memory device of claim 10, wherein the floating gate memory cells of the NAND architecture Flash memory device is adapted to be programmed by one of tunnel injection of electrons, channel hot electron injection (HEI), and substrate enhanced hot electron injection (SEHE).

12. The NAND architecture Flash memory device of claim 10, wherein the floating gate memory cells of the NAND architecture Flash memory device is adapted to be erased by one of tunneling, negative voltages applied to the control gate voltages with respect to the substrate or P-well, and substrate enhanced band to band tunneling induced hot hole injection (SEBBHH).

13. A NAND architecture Flash memory device, comprising:

a vertical floating gate NAND architecture memory array formed on a substrate having a plurality of pillars and associated intervening trenches;

a plurality of floating gate memory cells, wherein the floating gate memory cells are formed vertically on the sidewalls of the plurality of pillars and trenches;

wherein the plurality of floating gate memory cells are coupled into a plurality of NAND architecture memory strings by source/drain regions formed at the top of the plurality of pillars and at the bottom of the associated trenches;

a plurality of word lines, wherein each word line is coupled to one or more control gates of one or more floating gate memory cells, where each of the one or more floating gate memory cells is from a differing NAND architecture memory string of the plurality of NAND architecture memory strings;

at least one bitline, wherein the at least one bitline is coupled to a drain of a first floating gate memory cell of each NAND architecture memory string of the plurality of NAND architecture memory strings; and at least one source line, wherein the at least one source line is coupled to a source of a last memory cell of each NAND architecture memory string of the plurality of NAND architecture memory strings.

14. The NAND architecture Flash memory device of claim 13, wherein the first and last floating gate memory cells of each NAND architecture memory string are coupled to the at least one bitline and the at least one source line through a first and second select transistor.

15. A vertical floating gate NAND architecture memory cell string, comprising:

a NAND architecture floating gate memory cell string formed on a substrate having a plurality of floating gate memory cells coupled source/drain to source/drain in a serial string; and wherein vertical NAND architecture floating gate memory cell string is formed by forming a series of substrate pillars and trenches, where the floating gate memory cells are formed vertically within the trenches on the sidewalls of an adjacent pillar, such that each trench can hold two floating gate memory cells;

wherein the series of substrate pillars and trenches of the vertical NAND architecture floating gate memory cell string are formed on a P-well isolation region formed on the substrate and where the vertical NAND architecture floating gate memory cell string is isolated from adjacent structures formed on the substrate by one or more isolation regions formed between the vertical NAND architecture floating gate memory cell string and the adjacent structures, the one or more isolation regions thereby defining one or more sidewalls of the P-well isolation region.

16. A NAND architecture Flash memory device comprising:

a NAND architecture memory array formed on a substrate having a plurality of floating gate memory cells arranged in rows and columns and coupled into a plurality of NAND memory strings, wherein the floating gate memory cells are formed vertically on the sidewalls of the plurality of pillars and associated trenches formed on the substrate, and where the plurality of floating gate cells are coupled into the plurality of NAND memory strings by source/drain regions formed at the top of the plurality of pillars and at the bottom of the associated trenches;

a plurality of word lines, wherein each word line is coupled to one or more gates of a row of the floating gate memory cells;

a plurality of bitlines, wherein each bitline is coupled to a drain of a first floating gate memory cell of one or more strings; and at least one source line, wherein the at least one source line is coupled to a source of a last floating gate memory cell of one or more strings.

* * * * *